United States Patent
Pan et al.

(10) Patent No.: US 7,511,531 B2
(45) Date of Patent: *Mar. 31, 2009

(54) TEMPERATURE-COMPENSATED OUTPUT BUFFER

(75) Inventors: Dong Pan, Bosie, ID (US); Leel S. Janzen, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 21 days.

This patent is subject to a terminal disclaimer.

(21) Appl. No.: 11/519,697

(22) Filed: Sep. 11, 2006

(65) Prior Publication Data

US 2007/0018684 A1    Jan. 25, 2007

Related U.S. Application Data

(63) Continuation of application No. 10/896,139, filed on Jul. 20, 2004, now Pat. No. 7,116,129.

(51) Int. Cl.
*H03K 17/16* (2006.01)
(52) U.S. Cl. .............................. 326/32; 326/30; 326/86
(58) Field of Classification Search .................. 326/32, 326/82, 83, 86; 327/170, 112, 108
See application file for complete search history.

(56) References Cited

U.S. PATENT DOCUMENTS

| 5,291,071 | A | * | 3/1994 | Allen et al. ................. 327/108 |
| 5,336,942 | A | * | 8/1994 | Khayat ........................ 327/206 |
| 5,444,219 | A | * | 8/1995 | Kelly .......................... 219/505 |
| 5,463,331 | A |   | 10/1995 | Kuo |
| 5,694,073 | A |   | 12/1997 | Coots et al. |
| 5,696,719 | A |   | 12/1997 | Baek et al. |
| 5,886,515 | A | * | 3/1999 | Kelly .......................... 323/313 |
| 6,046,617 | A |   | 4/2000 | Hoeld |
| 6,094,085 | A |   | 7/2000 | Okayasu et al. |
| 6,097,237 | A | * | 8/2000 | Singh .......................... 327/389 |
| 6,388,488 | B1 |   | 5/2002 | Ho |
| 6,535,020 | B1 | * | 3/2003 | Yin ............................. 326/83 |
| 6,687,165 | B1 |   | 2/2004 | Ciaco |
| 6,717,865 | B2 |   | 4/2004 | Laurent |
| 6,985,014 | B2 | * | 1/2006 | Ajit ............................ 327/108 |
| 2002/0091958 | A1 |   | 7/2002 | Schoenfeld et al. |
| 2003/0115386 | A1 |   | 6/2003 | Porter et al. |
| 2003/0201804 | A1 |   | 10/2003 | Waldrop |

* cited by examiner

*Primary Examiner*—Vibol Tan
(74) *Attorney, Agent, or Firm*—TraskBritt

(57) ABSTRACT

A temperature-compensated output buffer circuit is disclosed, which includes a pull-up circuit including a first pull-up transistor for providing a first pull-up output signal responsive to a pull-up input signal, and a supplemental pull-up circuit in parallel with the first pull-up transistor. The supplemental pull-up circuit is configured to generate a supplemental pull-up output signal with the first pull-up output signal and the supplemental pull-up output signal, forming a pull-up output signal. The output buffer further includes a pull-down circuit, including a first pull-down transistor for providing a first pull-down output signal and a supplemental pull-down circuit in parallel with the first pull-down transistor. The supplemental pull-down circuit is configured to generate a supplemental pull-down output signal with the pull-up output signal and the pull-down output signal coupled to form an output buffer output signal. Methods of operation, memory devices, semiconductor substrates and electronic systems embodying the invention are also disclosed.

9 Claims, 9 Drawing Sheets

TEMPERATURE-COMPENSATED OUTPUT BUFFER

CROSS-REFERENCE TO RELATED APPLICATION

This application is a continuation of application Ser. No. 10/896,139, filed Jul. 20, 2004, now U.S. Pat. 7,116,129, issued Oct. 3, 2006.

BACKGROUND OF THE INVENTION

1. Field of the Invention

The present invention relates generally to buffer circuits and more particularly, to buffer circuits that compensate for environmental temperature changes.

2. State of the Art

Electronic products are generally comprised of a plurality of integrated circuits which are coupled to or interfaced with other integrated circuits according to various bus structures or other data interfaces. Interface specifications for coupling integrated circuits with one another specify performance parameters such as voltage and current levels required for digital signals to be accurately and reliably exchanged between two or more integrated circuits. Integrated circuits complying with the interface specifications compatibly exchange information through the use of output buffer circuits which present identifiable logic conditions such as logic low and logic high signal states. Additionally, output buffer circuits provide a mechanism for compatibly interfacing different logic families of integrated circuits.

An example of an output buffer circuit is illustrated with reference to FIG. 1. Generally, an output buffer circuit 10 uses an external voltage level, VCCQ, as a source for generating a logic high signal state. While technological advances result in a generally decreasing signal level for VCCQ, typical voltage ranges may include 1.8 volts to 5.5 volts. Output buffer circuits 10 generally use a lower voltage reference, VSSQ, which may be defined as a lesser positive or negative voltage level and more commonly utilizes a system potential reference or ground as a current sink to implement a logic low signal state. A typical output buffer circuit 10 generally includes complementary transistor devices, one of which is a p-channel pull-up transistor 12 with a source connected to VCCQ and a drain connected to an output terminal 14. Output buffer circuit 10 further includes as another complementary transistor device an n-channel pull-down transistor 16, the drain of which is connected to output terminal 14 with the source terminal connected to VSSQ.

Operationally, a transistor, such as transistors 12 and 16, when implemented as a metal-oxide semiconductor (MOS) transistor, behave as a constant current source when the drain-to-source voltage is greater than or equal to the difference between the threshold voltage and the gate-to-source voltage is in the saturation region. The MOS device, when in the linear region, behaves like a resistor when the drain-to-source voltage is less than the difference between the threshold voltage and the gate-to-source voltage.

Each of the transistors 12, 16, includes a gate input 18, 20 coupled to the respective input signals: pull-up signal and pull-down signal, which controls each transistor 12, 16 at the gate input 18, 20. To generate a logic high signal state on output terminal 14, a pull-up transistor 12 is turned on by logic at gate input 18, while a pull-down transistor 16 is turned off at gate input 20. Accordingly, switching the output to a high logic state enables current to flow from VCCQ to output terminal 14 via pull-up transistor 12 while pull-down transistor 16 assumes a high impedance state. Similarly, a logic low signal state at output terminal 14 is output when the pull-up transistor 12 is turned off, thus generating a high impedance state between output terminal 14 and VCCQ. In such a high impedance state between VCCQ and output terminal 14, current does not flow from VCCQ to output terminal 14. Additionally, pull-down transistor 16 is turned on at gate input 20 allowing current to pass from output terminal 14 to VSSQ, generally implemented as a ground potential. In such a configuration, upper buffer circuit 10 functions as a sink for current at output terminal 14. The gate inputs 18, 20 of pull-up transistor 12 and pull-down transistor 16 are typically coupled to receive a control signal having a logic level that activates one of the transistors and deactivates another one of the transistors.

An output buffer circuit finds application in a semiconductor memory system such as those commonly used in computer or computer-related applications. A typical memory may be used to store data, which may be utilized or processed by other integrated circuits, such as a microprocessor, which couples with the memory system. As memory system designs advance, faster transition times or data rates become factors in the implementation of interfacing specifications requiring advances in interfacing aspects, such as output buffer circuits. As performance and transition times increase, environmental conditions, including temperature variations, introduce variations in the performance of the memory systems. For output buffer circuits implemented in semiconductor devices, it is common for the output buffer circuit to diminish in current drive capacity in response to increases in temperature. The reduction in current drive capability results in reduced operating speeds as signal transitions exhibited at an output terminal of an output buffer circuit transition at a much slower rate. Therefore, since the output buffer circuit transitions at a slower rate, the overall memory system exhibits an overall reduction in performance.

Therefore, because the variations in environmental conditions associated with integrated circuits incorporating output buffer circuits result in unacceptable variations in logic level transition rates, there is a need for an improved output buffer circuit and methodology for accommodating variations in temperature conditions for high data rate devices.

BRIEF SUMMARY OF THE INVENTION

The present invention in several embodiments is directed to a temperature-compensated output buffer, including a method, circuit and system. In one embodiment of the present invention, an output buffer includes a pull-up circuit, including a first pull-up transistor for providing a first pull-up output signal responsive to a pull-up input signal and a supplemental pull-up circuit in parallel with the first pull-up transistor. The supplemental pull-up circuit is configured to generate a supplemental pull-up output signal with the first pull-up output signal and the supplemental pull-up output signal coupled to form a pull-up output signal. The output buffer further includes a pull-down circuit, including a first pull-down transistor for providing a first pull-down output signal responsive to a pull-down input signal and a supplemental pull-down circuit in parallel with the first pull-down transistor. The supplemental pull-down circuit is configured to generate a supplemental pull-down output signal with the pull-up output signal and the pull-down output signal coupled to form an output buffer output signal.

In another embodiment of the present invention, a memory device is provided, which includes an array of memory cells, a plurality of data lines for access to the memory cells and an output buffer coupled between the array of memory cells and the plurality of data lines. The output buffer includes at least one output buffer circuit further including a supplemental pull-up circuit configured in parallel with a first pull-up transistor, with the supplemental pull-up circuit being responsive to a supplemental pull-up control signal variable over a temperature range. The output buffer further includes a supplemental pull-down circuit configured in parallel with a first pull-down transistor. The supplemental pull-down circuit being responsive to a supplemental pull-down control signal variable over a temperature range.

In yet another embodiment of the present invention, a semiconductor substrate on which is fabricated a semiconductor memory device is provided. The substrate includes an array of memory cells, a plurality of data lines for access to the memory cells and an output buffer coupled between the array of memory cells and the plurality of data lines. The output buffer includes at least one output buffer circuit, including a supplemental pull-up circuit configured in parallel with a first pull-up transistor. The supplemental pull-up circuit being responsive to a supplemental pull-up control signal that is variable over a temperature range. The output buffer further includes a supplemental pull-down circuit configured in parallel with a first pull-down transistor. The supplemental pull-down circuit is responsive to a supplemental pull-down control signal variable over a temperature range.

In yet a further embodiment of the present invention, a method of providing a data output signal includes generating a first pull-up output signal in response to a first pull-up input signal. A supplemental pull-up output signal is generated, which is responsive to a supplemental pull-up control signal, the supplemental pull-up control signal being variable with temperature variations. A first pull-down output signal is generated in response to a first pull-down input signal with a supplemental pull-down output signal being generated in response to a supplemental pull-down control signal, the supplemental pull-down control signal varying with temperature variations. The first pull-up output signal and the supplemental pull-up output signal are combined to form a pull-up output signal with the first pull-down output signal and the supplemental pull-down output signal to form a pull-down output signal.

In yet an additional embodiment of the present invention, an electronic system comprising an input device, an output device, a memory device, and a processor device coupled to the input, output, and memory devices, with at least one of the input, output, memory, and processor devices including a semiconductor memory, is provided. The system includes an array of memory cells, a plurality of data lines for access to the memory cells and an output buffer coupled between the array of memory cells and the plurality of data lines. The output buffer includes at least one output buffer circuit comprising a supplemental pull-up circuit responsive to a supplemental pull-up control signal variable over a temperature range and a supplemental pull-down circuit responsive to a supplemental pull-down control signal variable over a temperature range.

BRIEF DESCRIPTION OF THE SEVERAL VIEWS OF THE DRAWINGS

In the drawings, which illustrate what is currently considered to be the best mode for carrying out the invention.

DETAILED DESCRIPTION OF THE INVENTION

Figure 1:
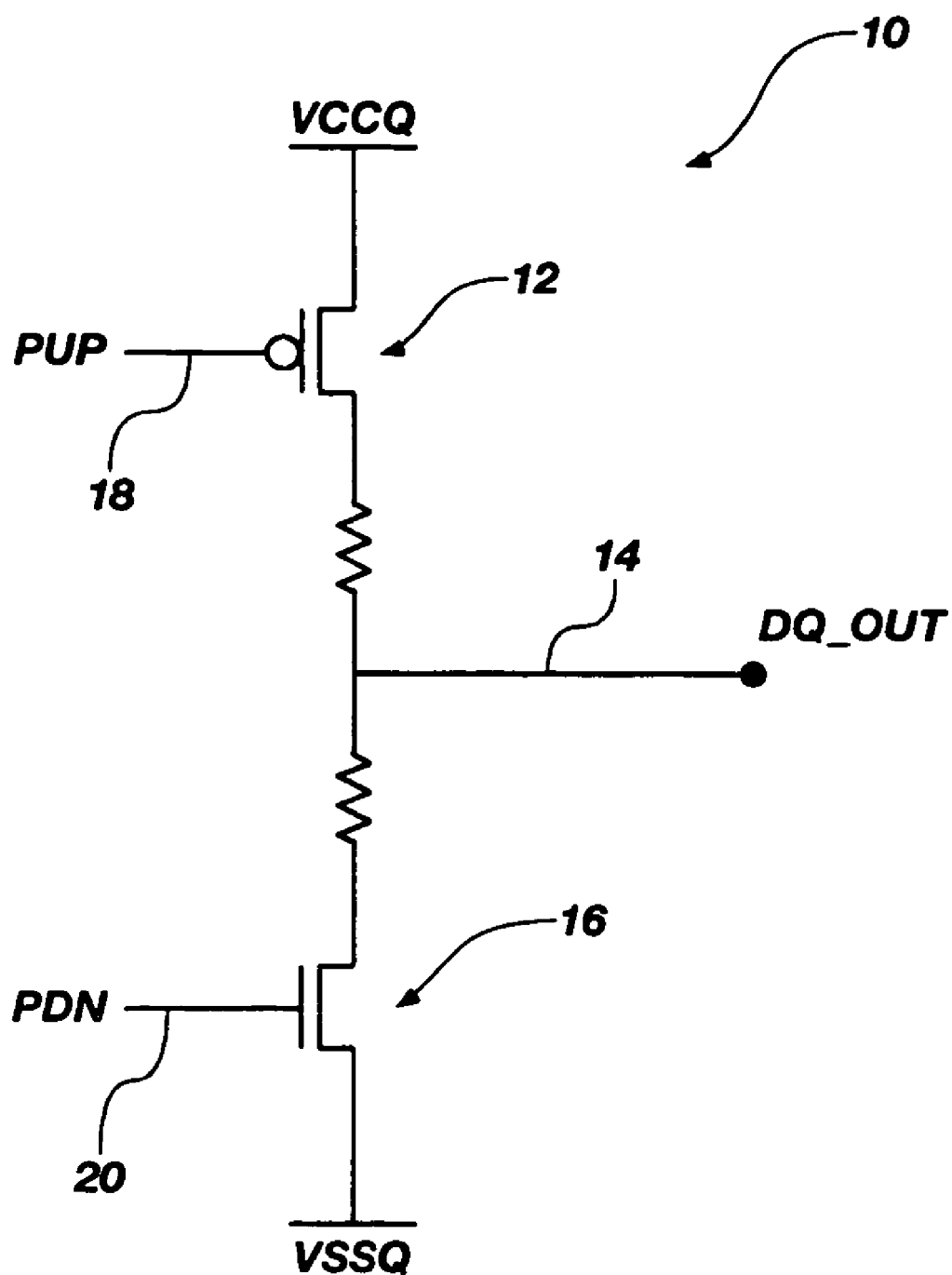
FIG. 1 is a circuit diagram of an output buffer circuit, in accordance with the prior art.
Figure 2:
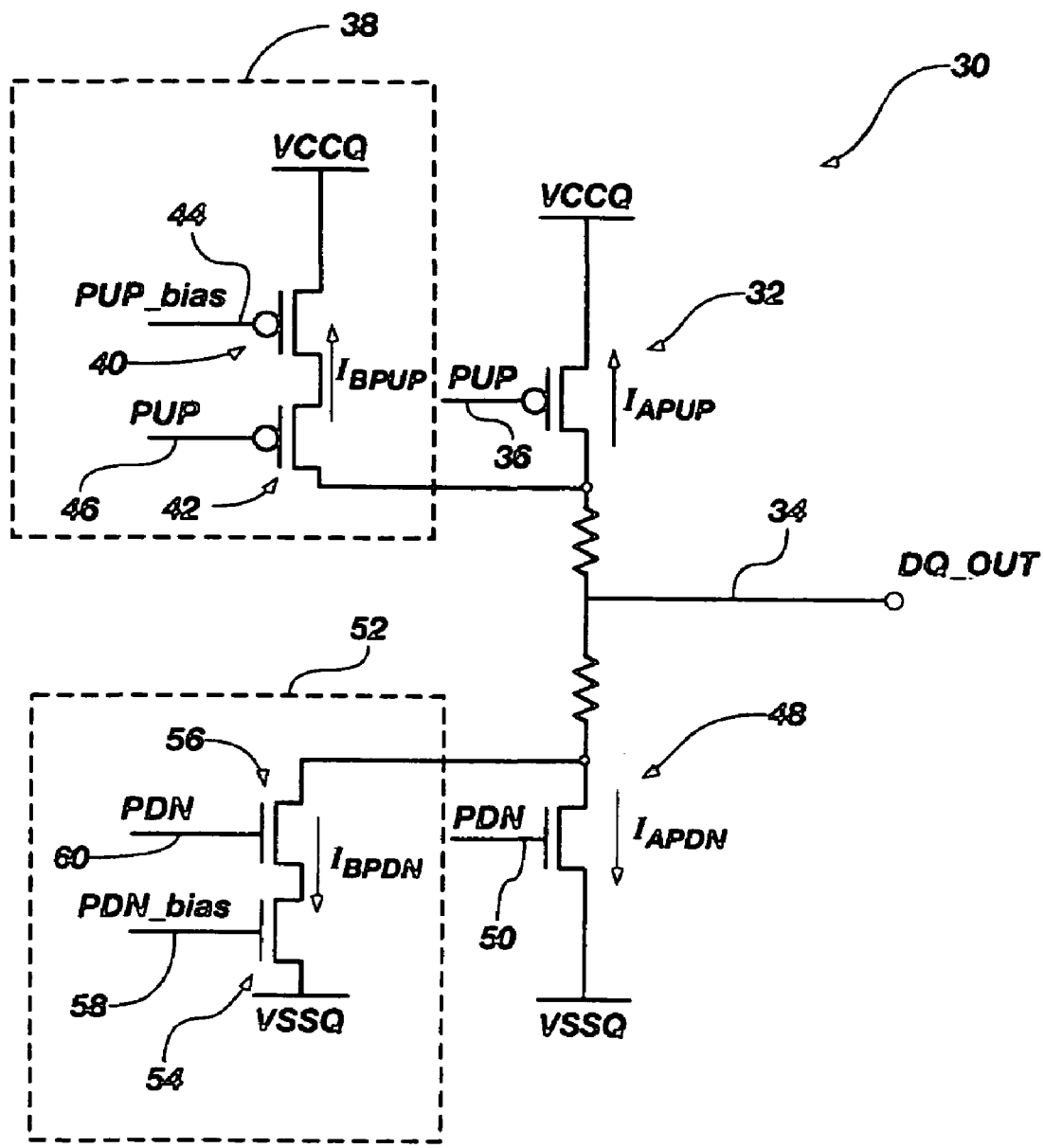
FIG. 2 is a circuit diagram of an output buffer circuit including temperature-compensating circuitry, in accordance with an embodiment of the present invention.

FIG. 2 illustrates an exemplary output buffer circuit, in accordance with an embodiment of the present invention. An output buffer circuit 30 includes a first pull-up transistor 32 coupled between a supply voltage, VCCQ, and an output terminal 34 for providing at least a partial sourcing of current to output terminal 34 when activated by a pull-up signal at gate input 36. While first pull-up transistor 32 may generally provide adequate pull-up sourcing of current to output terminal 34, the performance of first pull-up transistor 32, if configured individually, would reflect variations in sourcing current as exhibited at output terminal 34 over variations in temperature. To compensate for such sourcing variations over temperature, a supplemental pull-up circuit 38 is coupled in a parallel configuration with first pull-up transistor 32. In one exemplary embodiment, supplemental pull-up circuit 38 includes a second pull-up transistor 40 and a third pull-up transistor 42. Second pull-up transistor 40 includes a gate input 44 which is driven by a temperature-compensating bias signal, PUP_bias. An exemplary circuit for generating the PUP_bias signal is discussed below with reference to FIG. 4. Third pull-up transistor 42 of supplemental pull-up circuit 38 includes a gate input 46 coupled to a pull-up signal, PUP.

Output buffer circuit 30 further includes a first pull-down transistor 48 coupled between a voltage, VSSQ, and the output terminal 34 for providing at least a partial sinking of current from output terminal 34 when activated by a pull-down signal at gate input 50. While first pull-down transistor 48 may generally provide adequate pull-down sinking of current from output terminal 34, the performance of first pull-down transistor 48, if configured individually, would reflect variations in sinking current, as exhibited at output terminal 34, over variations in temperature. To compensate for such current sinking variations over temperature, a supplemental pull-down circuit 52 is coupled in a parallel configuration with first pull-down transistor 48. In one exemplary embodiment, supplemental pull-down circuit 52 includes a second pull-down transistor 54 and a third pull-down transistor 56. Second pull-down transistor 54 is coupled to a lower potential voltage, VSSQ, and is controlled on gate input 58 by a biasing signal, PDN_bias, which accommodates variations in sinking current associated with variations in temperature. A specific formation of PDN_bias signal is illustrated below with reference to FIG. 4. Third pull-down transistor 56 is coupled in a series configuration with second pull-down transistor 54. Third pull-down transistor 56 is controlled at a gate input 60 by a pull-down signal, PDN, and in conjunction with the activation of second pull-down transistor 54, augments the pull-down or sinking performance of first pull-down transistor 48.

Figure 3:
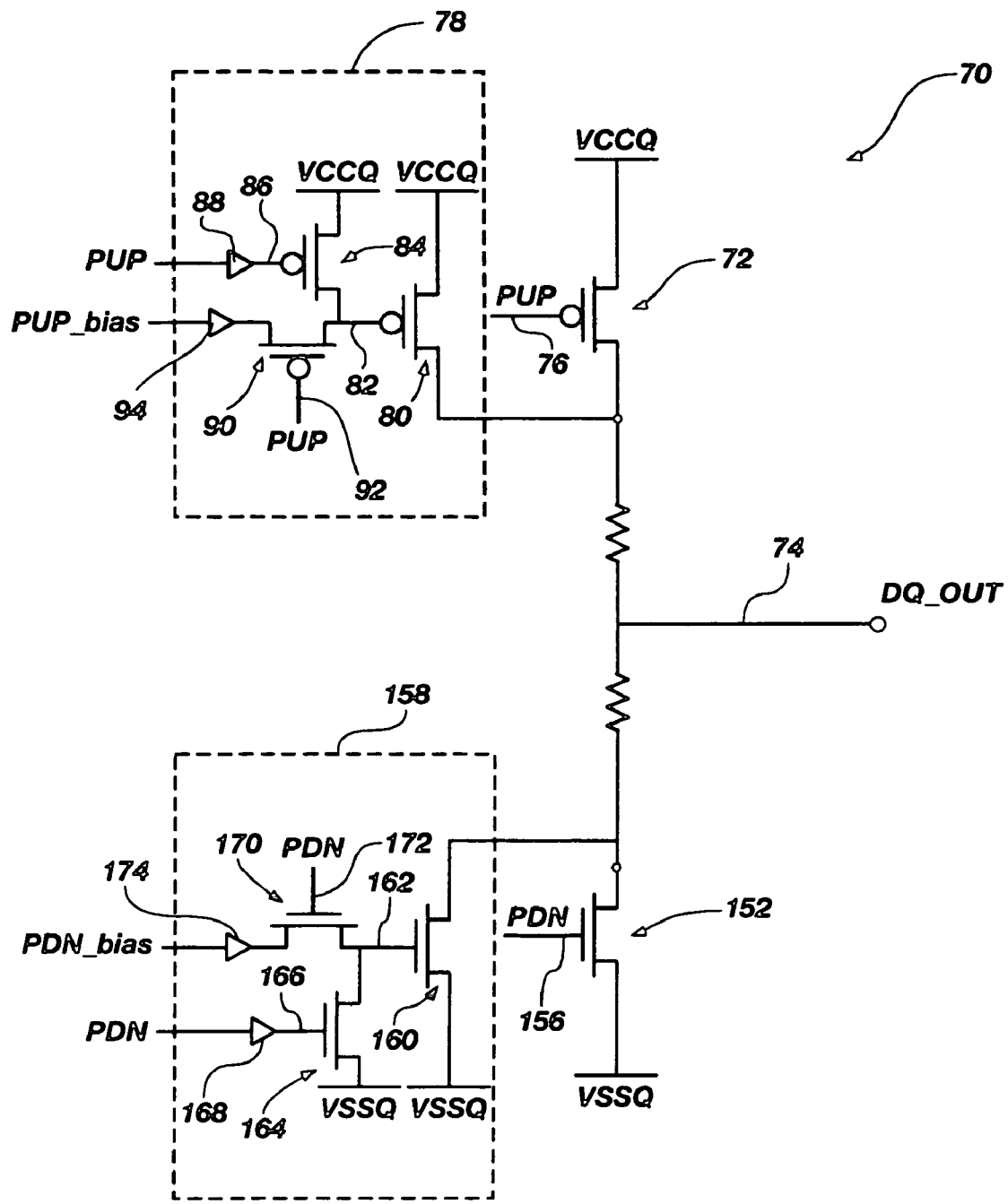
FIG. 3 is a circuit diagram of an output buffer circuit including temperature-compensating circuitry, in accordance with another embodiment of the present invention.

FIG. 3 illustrates an exemplary output buffer circuit, in accordance with another embodiment of the present invention. An output buffer circuit 70 includes a first pull-up transistor 72 coupled between a supply voltage, VCCQ, and an output terminal 74 for providing at least a partial sourcing of current to output terminal 74 when activated by a pull-up signal at gate input 76. While first pull-up transistor 72 may generally provide adequate pull-up sourcing of current to output terminal 74, the performance of first pull-up transistor 72, if configured individually, would reflect variations in sourcing current over variations in temperature as exhibited at output terminal 74.

To compensate for such sourcing variations over temperature, a supplemental pull-up circuit 78 is coupled in a parallel configuration with first pull-up transistor 72. In one exemplary embodiment, supplemental pull-up circuit 78 includes a second pull-up transistor 80, which is coupled in parallel with first pull-up transistor 72. Second pull-up transistor 80 is controlled at a gate input 82, which is further coupled to a third pull-up transistor 84 coupled between gate input 82 of second pull-up transistor 80 and a supply voltage, VCCQ. A gate input 86 of third pull-up transistor 84 is controlled by a pull-up signal, PUP, as passed through a first buffer 88. Gate input 82 of second pull-up transistor 80 is also controlled by a fourth transistor 90, which is controlled at a gate input 92 by a pull-up signal, PUP. Fourth transistor 90 is coupled between gate input 82 of second pull-up transistor 80 and a second buffer 94, which is further coupled to a pull-up bias signal, PUP_bias, which is generated as described with reference to FIG. 4.

Output buffer circuit 70 further includes a first pull-down transistor 152 coupled between a supply voltage, VSSQ, and an output terminal 74 for providing at least a partial sinking of current from output terminal 74 when activated by a pull-down signal at gate input 156. While first pull-down transistor 152 may generally provide adequate pull-down sinking of current from output terminal 74, the performance of first pull-down transistor 152, if configured individually, would reflect variations in sinking current as exhibited at output terminal 74 over variations in temperature.

To compensate for such sinking variations over temperature, a supplemental pull-down circuit 158 is coupled in a parallel configuration with first pull-down transistor 152. In one exemplary embodiment, supplemental pull-down circuit 158 includes a second pull-down transistor 160 that is coupled in parallel with first pull-down transistor 152. Second pull-down transistor 160 is controlled at a gate input 162 which is further coupled to a third pull-down transistor 164 coupled between gate input 162 of second pull-down transistor 160 and a reference voltage, VSSQ. A gate input 166 of third pull-down transistor 164 is controlled by a pull-down signal, PDN, as passed through a third buffer 168. Gate input 162 of second pull-down transistor 160 is also controlled by a fourth transistor 170, which is controlled at a gate input 172 by a pull-down signal, PDN. Fourth transistor 170 is coupled between gate input 162 of second pull-down transistor 160 and a fourth buffer 174, which is further coupled to a pull-down bias signal, PDN_bias, which is generated as described with reference to FIG. 4.

Figure 4:
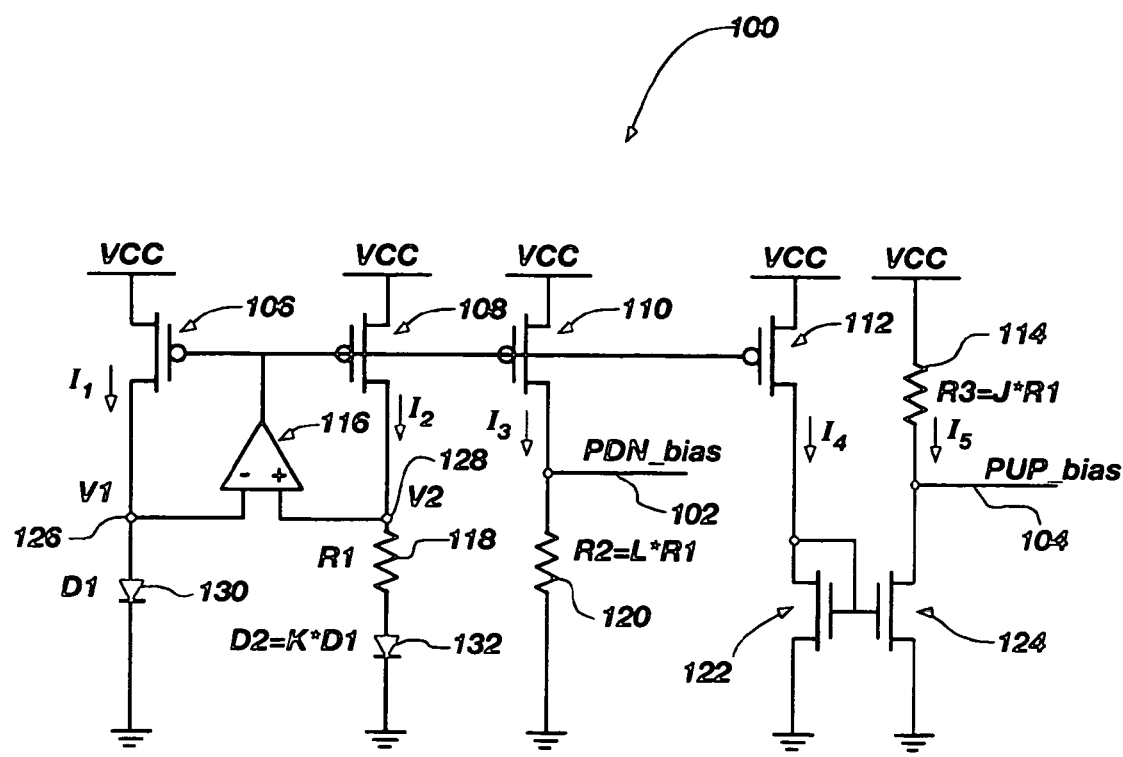
FIG. 4 is a circuit diagram of a biasing circuit configured for generating biasing signals variable with varying temperature for coupling with an output buffer circuit, in accordance with an embodiment of the present invention.

FIG. 4 is a schematic diagram of a biasing circuit, in accordance with an embodiment of the present invention. A biasing circuit 100 provides biasing control signals to output buffer circuits to facilitate temperature compensation for reducing the variations in logic level transitions associated with temperature as exhibited on the respective output terminals of the corresponding output buffer circuits described herein. Biasing circuit 100, in conjunction with output buffer circuits, form an output buffer for interfacing an output of an integrated circuit with an input of another integrated circuit. Biasing circuit 100 generates a PDN_bias signal 102 exhibited in the form of a voltage, which, in one embodiment, exhibits a positive temperature coefficient (PTAT). Biasing circuit 100 further generates a constant PUP_bias signal 104 that exhibits a complementary temperature coefficient (CTAT).

Biasing circuit 100 comprises five individual circuit legs, each illustrated as passing respective currents $I_1$ through $I_5$. The circuit legs passing currents $I_1$ and $I_2$ include transistors 106, 108, which are coupled together with a differential amplifier 116 configured to operate by maintaining potential V1 at location 126 at an equivalent potential as potential V2 at location 128. In order to maintain the equivalents in potential, differential amplifier 116 outputs a signal that drives each of the respective transistors 106, 108, 110 and 112. The other respective components, namely $D_1$ 130, $R_1$ 118 and $D_2$ 132 form a temperature sensitive circuit resulting in variations on the output of differential amplifier 116, which drives the other respective circuit legs.

Biasing circuit 100 further comprises a circuit leg comprised of transistor 110 and resistor $R_2$ 120 passing therethrough a current $I_3$. This reference leg generates PDN_bias signal 102, which, in the present circuit, is implemented as a positive temperature coefficient (PTAT) that varies according to the temperature sensitivity of the circuits associated with the circuit legs passing the currents $I_1$ and $I_2$.

The remaining circuit legs passing currents $I_4$ and $I_5$ are implemented to include a transistor 112 coupled to transistors 122 and 124 configured in a current mirror arrangement, which, in conjunction with resistor $R_3$ 114, form a complementary bias signal, PUP_bias signal 104, which in the present example is implemented as a complementary to absolute temperature (CTAT) reference.

Biasing circuit 100 is configured as a low voltage temperature compensation bias voltage generating circuit, in accordance with an embodiment of the present invention. Biasing circuit 100 generates a constant PDN_bias voltage and a PUP_bias voltage according to the equations listed below. While a specific implementation is listed below, other variations for generating bias voltages are also contemplated within the scope of the present invention. In accordance with the illustrated embodiment, it is assumed that current $I_1$ and $I_2$ are attempted to be maintained the same through the use of a differential amplifier 116, which attempts to maintain V1 equal to V2. From such an assumption, PDN_bias may be calculated as:

$$V_{PDN_{13} bias} = n*V_T*lnK*L.$$

With regard to the above equation, n is the emission coefficient (i.e., relative to the doping profile that in one exemplary process is approximately 1.0). Furthermore, $V_T$ is the thermal voltage (i.e., in one exemplary embodiment is about 25.4 mV at room temperature). The temperature coefficient of $V_{PDN\_bias}$ is derivable by the following equations:

$$d(V_{PDN\_bias})/dT = n*lnK*L*dV_T/dT$$

$dV_T/dT$ is a constant=0.085 mV/C. By picking $K$=8, $L$=17, using $n$=1, we get $V_{PDN\_bias}$=898 mV at 25 C $d(V_{PDN\_bias})/dT$=3 mV/C For one conventional integrated circuit specification, a typical temperature range as specified is from 0 to 85° C. In one exemplary implementation, the voltage change between V1 and V2 is about 255 mV, which results in about ⅓ of the default value. From the above equations, it is shown that $V_{PDN\_bias}$ and the $d(V_{PDN\_bias})/dT$ is not related to the resistor value or the transistor characteristics. Therefore, biasing circuit 100 is insensitive to process variations.

Figure 5:
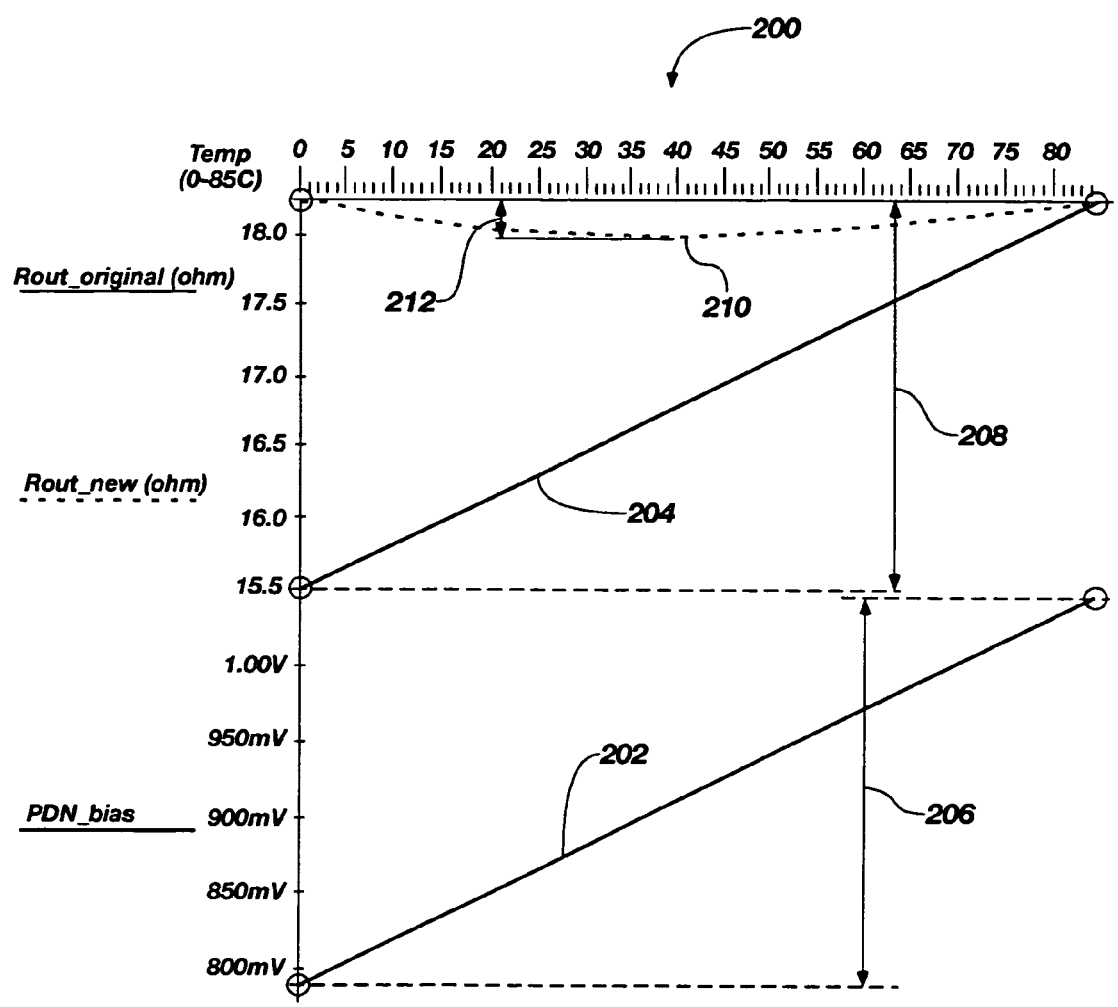
FIG. 5 illustrates an exemplary performance plot of an output buffer, in accordance with one or more embodiments of the present invention.

FIG. 5 illustrates an exemplary performance plot of an output buffer, in accordance with one or more embodiments of the present invention. In plot 200, variations in temperature are illustrated along the horizontal axis, while variations in the voltage signals are illustrated using the vertical axis. According to the plot of FIG. 5, an output terminal of the output buffer circuit, when implemented in accordance with the prior art, exhibits variations in voltage across temperature as exhibited in curve 204, which exhibits a variation 208 across the temperature range of approximately 2.77 ohms as exhibited at the output impedance of the output buffer DQ_out. When the biasing circuit 100 is employed in conjunction with one of the embodiments of the output buffer circuit to form an output buffer, variations in the output resistance across the temperature range results in a curve 210 having a variation 212 of approximately 0.29 ohms. An exemplary plot of the PDN_bias signal 202 as utilized by the output buffer circuits, illustrates a range 206 of approximately 257 mV, which changes from about 0.79 V to 1.05 V within the 0 to 85° C. range.

Figure 6:
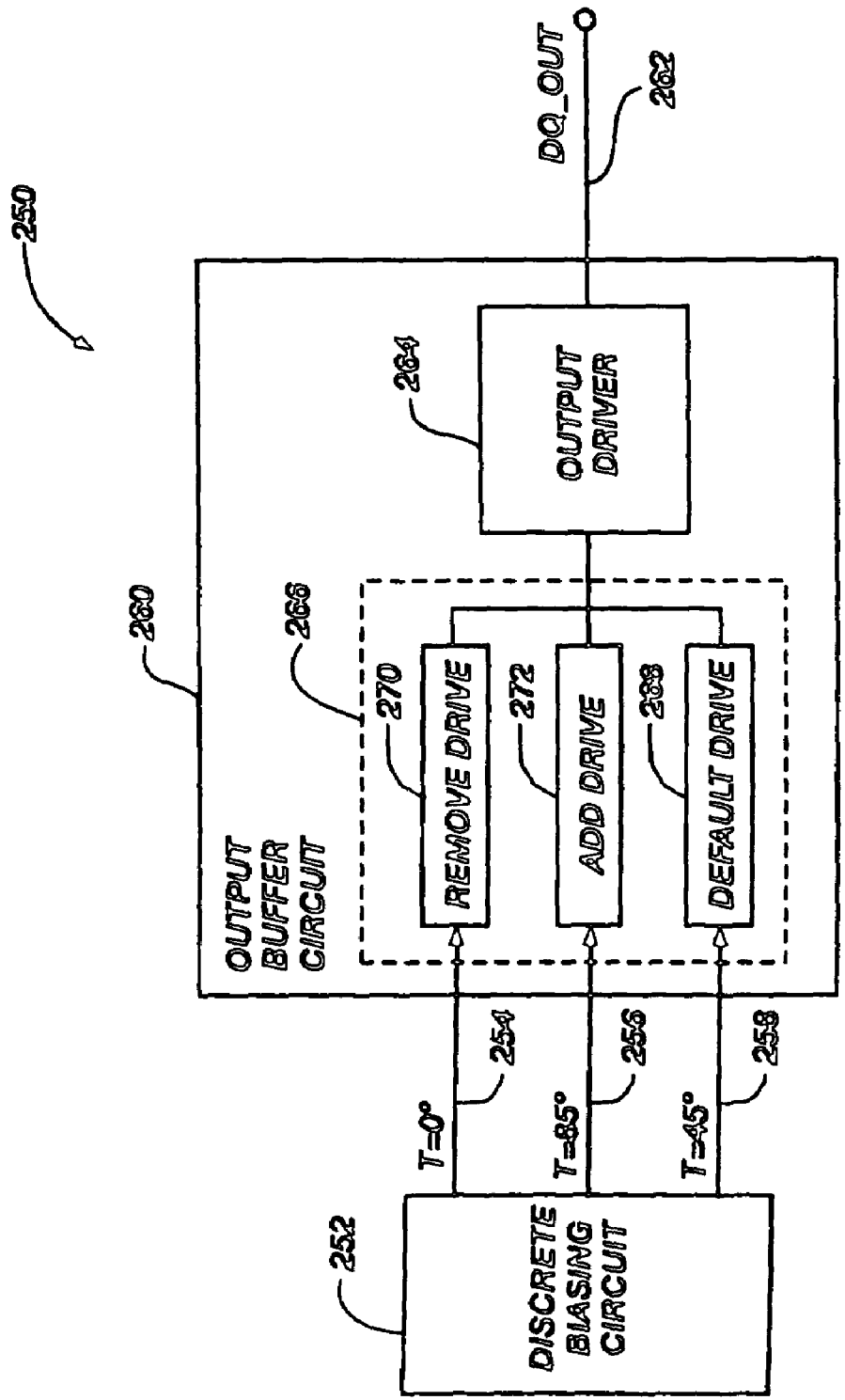
FIG. 6 illustrates a block diagram of an output buffer incorporating a discrete biasing circuit, in accordance with an embodiment of the present invention.

FIG. 6 is a block diagram of an output buffer, in accordance with an embodiment of the present invention. An output buffer 250 is configured to add and remove incremental discrete amounts of drive to an output terminal of an output buffer. Output buffer 250 includes a discrete biasing circuit 252 configured to output discrete control signals with varying levels of discrete resolution. By way of example and not limitation, three discrete supplemental control signals 254, 256, 258 are illustrated as originating from discrete biasing circuit 252 and are representative of discrete control signals corresponding to detected variations in temperature. Output buffer 250 further includes an output buffer circuit 260 which generates the respective drive levels for an output terminal 262. Output buffer circuit 260 includes an output driver 264, which may be implemented according to first pull-up and pull-down transistors 32, 48 of FIG. 2. Output buffer circuit 260 further includes supplemental circuits 266, which, in one embodiment, may be implemented as a series of augmenting pull-up and pull-down circuit legs. In one embodiment, a default number of driver legs may be employed and is illustrated as default drive 268 corresponding to an identified ambient condition of operation for output buffer 250. When lower temperatures are detected, a portion of the drive may be removed as illustrated by remove drive 270. Similarly, when an increased temperature level is detected, additional legs or additional drive may be added to the output driver through the activation of an add drive 272.

Figure 7:
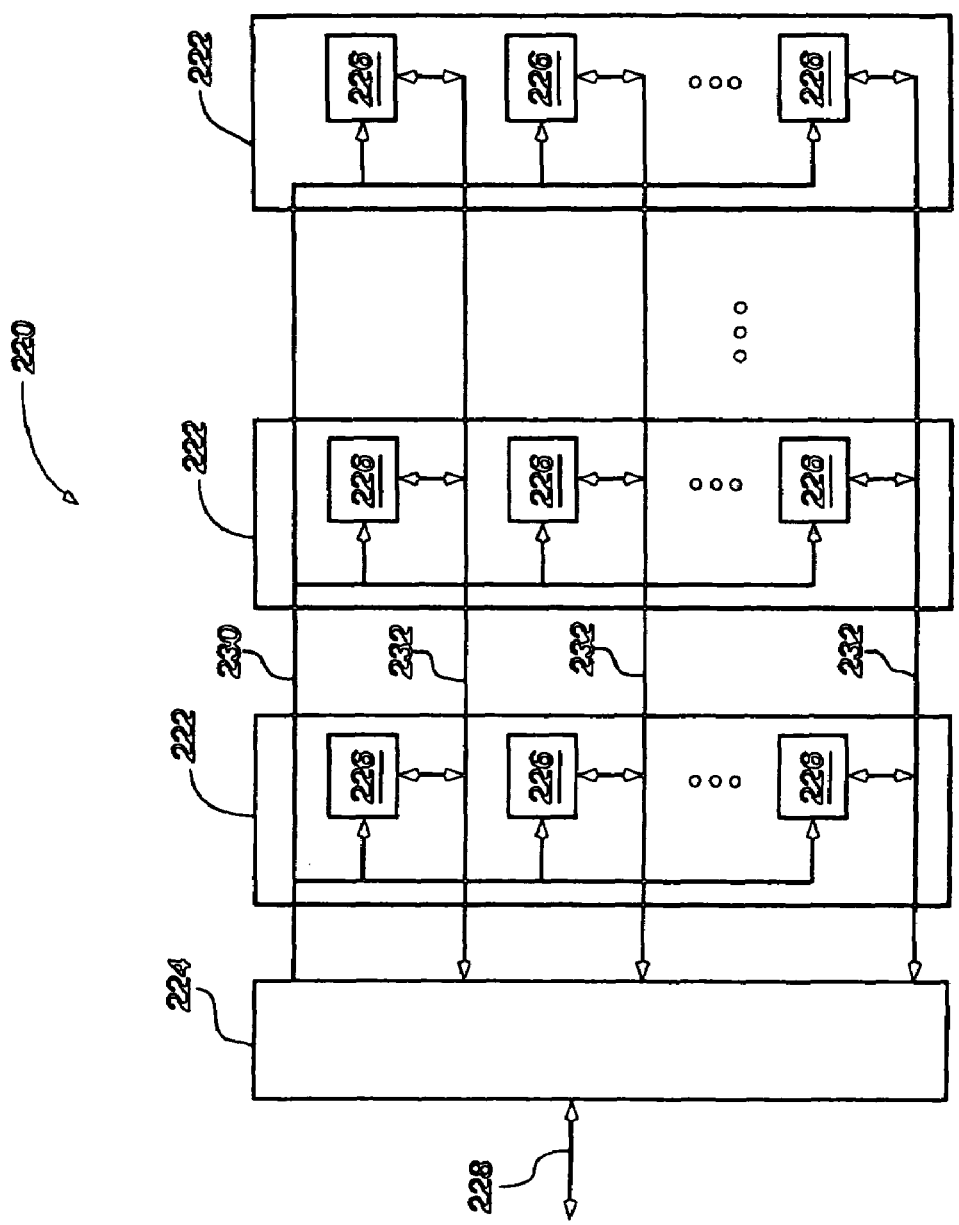
FIG. 7 is a block diagram of a memory system containing one or more integrated circuits having one or more output buffers, in accordance with an embodiment of the present invention.

FIG. 7 is a block diagram of a memory system containing one or more integrated circuits having one or more output buffers incorporated therein, in accordance with an embodiment of the present invention. Memory system 220 contains one or more memory modules 222 and a memory controller 224. Each memory module 222 includes at least one memory device 226. Memory controller 224 provides and controls a bidirectional interface between memory system 220 and an external system bus 228. Memory system 220 accepts a command signal from the external system bus 228 and relays it to one or more memory modules 222 on a command line 230. Memory system 220 provides for data input and data output between the one or more memory modules 222 and external system bus 228 on data lines 232. At least one of the memory devices 226 includes the output buffer comprised of an output buffer circuit and a biasing circuit, as discussed with reference to the various embodiments of the present invention.

Figure 8:
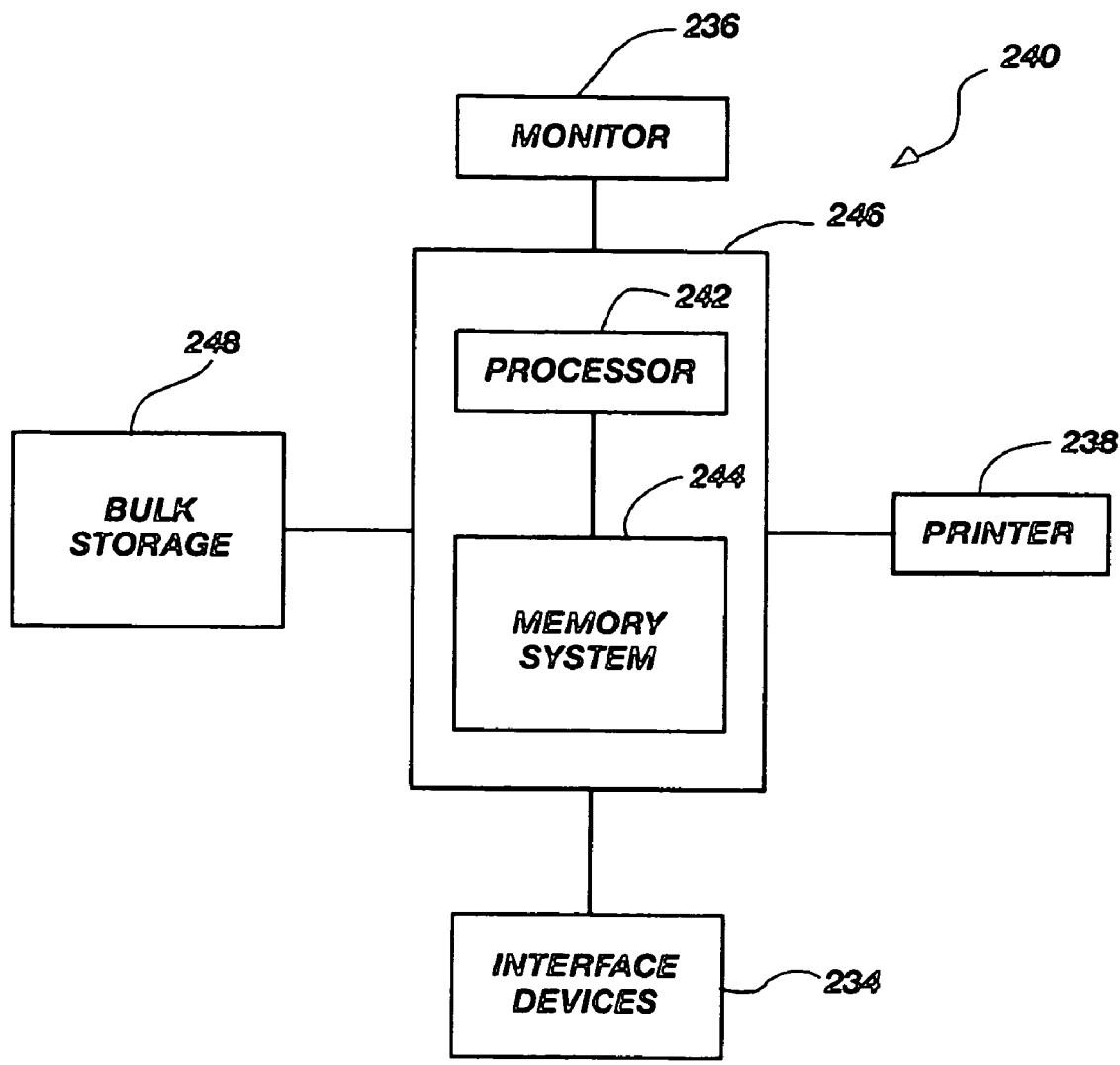
FIG. 8 is a block diagram of a system containing a memory device, according to an embodiment of the present invention.

FIG. 8 is a block diagram of a system containing a memory device, according to an embodiment of the present invention. Electronic system 240 contains a processor 242 and a memory system 244 housed in a computer unit 246. Memory system 244 includes a memory device that includes the output buffer that is further comprised of an output buffer circuit and a biasing circuit, in accordance with the various embodiments of the present invention discussed herein. Electronic system 240 optionally includes user interface devices 234, a monitor 236, a printer 238 and a bulk storage 248. It will be appreciated that other components are often associated with electronic system 240. It will be further appreciated that the processor 242 and memory system 244 can be on a single system or device.

Figure 9:
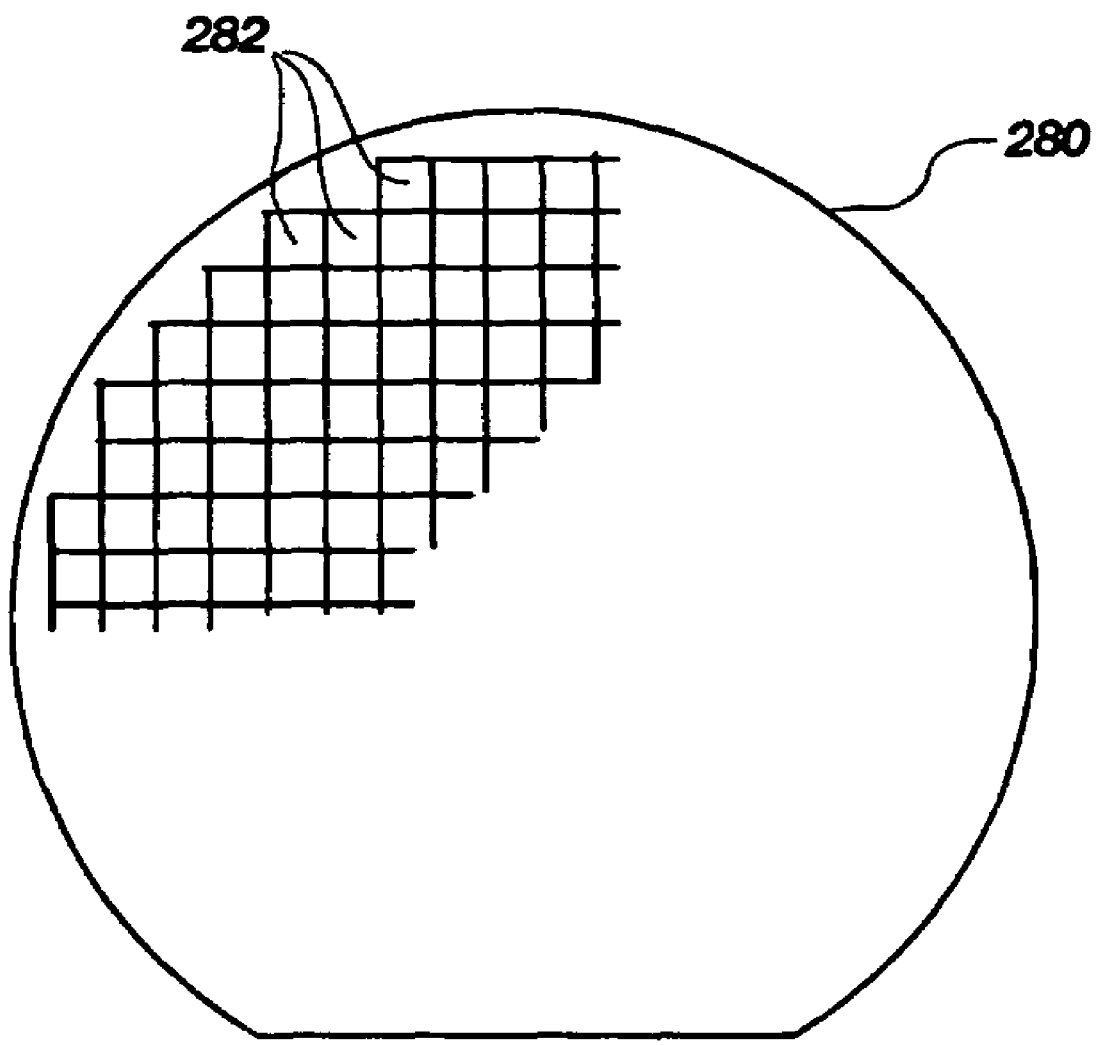
FIG. 9 is a view of a bulk semiconductor substrate in the form of a semiconductor wafer including one or more integrated circuits having one or more output buffers associated therewith, in accordance with an embodiment of the present invention.

With regard to FIG. 9, memory devices of the type described herein are generally fabricated as on a bulk semiconductor substrate, such as a wafer or other substrate, in the form of a silicon on insulator (SOI) substrate, including, by way of example, a silicon on glass (SOG) substrate, a silicon on sapphire (SOS) substrate and a silicon on ceramic (SOC) substrate; a variety of semiconductor devices having integrated circuits fabricated thereon as shown in FIG. 9. The integrated circuits 282 are supported by a substrate 280. Identical integrated circuits 282 are typically replicated many times on each bulks substrate and are further processed into separate semiconductor devices as is known by those of ordinary skill in the art.

Although the foregoing description contains many specifics, these are not to be construed as limiting the scope of the present invention, but merely as providing certain exemplary embodiments. Similarly, other embodiments of the invention may be devised that do not depart from the spirit or scope of the present invention. The scope of the invention is, therefore, indicated and limited only by the appended claims and their legal equivalents, rather than by the foregoing description. All additions, deletions, and modifications to the invention, as disclosed herein, which fall within the meaning and scope of the claims, are encompassed by the present invention.

What is claimed is:

1. An output buffer, comprising:
   a pull-up circuit including a pull-up transistor for providing a pull-up output signal responsive to a pull-up input signal;
   a pull-down circuit including a pull-down transistor for providing a pull-down output signal responsive to a pull-down input signal;
   a first supplemental circuit in parallel with one of the pull-up transistor or the pull-down transistor, the first supplemental circuit configured to generate, in response to a first supplemental control signal, a first supplemental output signal, the pull-up output signal, the pull-down output signal and the first supplemental output signal coupled to form an output buffer output signal; and wherein the first supplemental output signal is variable with temperature variation as determined by a comparison of electrical changes in temperature sensitive elements, wherein the first supplemental circuit is in parallel with the first pull-up transistor and wherein the first supplemental output signal is a pull-up supplemental output signal configured to adjust a pull-up capability of the output buffer, and wherein the first supplemental circuit comprises a series-configured second pull-up transistor and a third pull-up transistor, the second and third pull-up transistors each controlled by one of the pull-up input signal and the first supplemental control signal.

2. An output buffer, comprising:

a pull-up circuit including a pull-up transistor for providing a pull-up output signal responsive to a pull-up input signal;

a pull-down circuit including a pull-down transistor for providing a pull-down output signal responsive to a pull-down input signal;

a first supplemental circuit in parallel with one of the pull-up transistor or the pull-down transistor, the first supplemental circuit configured to generate, in response to a first supplemental control signal, a first supplemental output signal, the pull-up output signal, the pull-down output signal and the first supplemental output signal coupled to form an output buffer output signal; and wherein the first supplemental output signal is variable with temperature variation as determined by a comparison of electrical changes in temperature sensitive elements, wherein the first supplemental circuit is in parallel with the first pull-up transistor and wherein the first supplemental output signal is a pull-up supplemental output signal configured to adjust a pull-up capability of the output buffer, and wherein the first supplemental circuit comprises a second pull-up transistor configured in parallel with the first pull-up transistor, the second pull-up transistor controlled in part by each of the pull-up input signal and the first supplemental control signal.

3. The output buffer of claim 2, further comprising:

a third pull-up transistor controlled by the pull-up input signal and configured to pull up a gate input of the second pull-up transistor; and a fourth pull-up transistor controlled by the pull-up input signal and configured to pull up a gate input of the second pull-up transistor to a level of the first supplemental control signal.

4. An output buffer, comprising:

a pull-up circuit including a pull-up transistor for providing a pull-up output signal responsive to a pull-up input signal;

a pull-down circuit including a pull-down transistor for providing a pull-down output signal responsive to a pull-down input signal;

a first supplemental circuit in parallel with one of the pull-up transistor or the pull-down transistor, the first supplemental circuit configured to generate, in response to a first supplemental control signal, a first supplemental output signal, the pull-up output signal, the pull-down output signal and the first supplemental output signal coupled to form an output buffer output signal; and wherein the first supplemental output signal is variable with temperature variation as determined by a comparison of electrical changes in temperature sensitive elements, and wherein the first supplemental output signal is a pull-down supplemental output signal configured to adjust a pull-down capability of the output buffer, and wherein the first supplemental circuit comprises a series-configured second pull-down transistor and a third pull-down transistor, the second and third pull-down transistors each controlled by one of the pull-down input signal and the first supplemental control signal.

5. An output buffer, comprising:

a pull-up circuit including a pull-up transistor for providing a pull-up output signal responsive to a pull-up input signal;

a pull-down circuit including a pull-down transistor for providing a pull-down output signal responsive to a pull-down input signal;

a first supplemental circuit in parallel with one of the pull-up transistor or the pull-down transistor, the first supplemental circuit configured to generate, in response to a first supplemental control signal, a first supplemental output signal, the pull-up output signal, the pull-down output signal and the first supplemental output signal coupled to form an output buffer output signal; and wherein the first supplemental output signal is variable with temperature variation as determined by a comparison of electrical changes in temperature sensitive elements, and wherein the first supplemental output signal is a pull-down supplemental output signal configured to adjust a pull-down capability of the output buffer, and wherein the first supplemental circuit comprises a second pull-down transistor configured in parallel with the first pull-down transistor, the second pull-down transistor controlled in part by each of the pull-down input signal and the first supplemental control signal.

6. The output buffer of claim 5, further comprising:

a third pull-down transistor controlled by the pull-down input signal and configured to pull down a gate input of the second pull-down transistor; and a fourth pull-down transistor controlled by the pull-down input signal and configured to pull down a gate input of the second pull-down transistor to a level of the first supplemental control signal.

7. An output buffer, comprising:

a pull-up circuit including a pull-up transistor for providing a pull-up output signal responsive to a pull-up input signal;

a pull-down circuit including a pull-down transistor for providing a pull-down output signal responsive to a pull-down input signal;

a first supplemental circuit in parallel with one of the pull-up transistor or the pull-down transistor, the first supplemental circuit configured to generate, in response to a first supplemental control signal, a first supplemental output signal, the pull-up output signal, the pull-down output signal and the first supplemental output signal coupled to form an output buffer output signal; and wherein the first supplemental output signal is variable with temperature variation as determined by a comparison of electrical changes in temperature sensitive elements and the output buffer further comprising a second supplemental circuit in parallel with the other one of the pull-up transistor or the pull-down transistor, the second supplemental circuit configured to generate, in response to a second supplemental control signal, a second supplemental output signal, the pull-up output signal, the pull-down output signal, the first supplemental output signal and the second supplemental output signal coupled to form the output buffer output signal; and wherein the second supplemental output signal is variable with temperature variation.

8. An output buffer, comprising:

a pull-up circuit including a pull-up transistor for providing a pull-up output signal responsive to a pull-up input signal;

a pull-down circuit including a pull-down transistor for providing a pull-down output signal responsive to a pull-down input signal;

a first supplemental circuit in parallel with one of the pull-up transistor or the pull-down transistor, the first supplemental circuit configured to generate, in response to a first supplemental control signal, a first supplemental output signal, the pull-up output signal, the pull-down output signal and the first supplemental output signal coupled to form an output buffer output signal; and wherein the first supplemental output signal is variable with temperature variation as determined by a comparison of electrical changes in temperature sensitive elements and the output buffer further comprising a biasing circuit for generating the pull-up control signal and the pull-down control signal for controlling the first supplemental circuit, wherein the biasing circuit is configured to generate the pull-up control signal as complementary to absolute temperature (CTAT).

9. An output buffer, comprising:

a pull-up circuit including a pull-up transistor for providing a pull-up output signal responsive to a pull-up input signal;

a pull-down circuit including a pull-down transistor for providing a pull-down output signal responsive to a pull-down input signal;

a first supplemental circuit in parallel with one of the pull-up transistor or the pull-down transistor, the first supplemental circuit configured to generate, in response to a first supplemental control signal, a first supplemental output signal, the pull-up output signal, the pull-down output signal and the first supplemental output signal coupled to form an output buffer output signal; and wherein the first supplemental output signal is variable with temperature variation as determined by a comparison of electrical changes in temperature sensitive elements and the output buffer further comprising a biasing circuit for generating the pull-up control signal and the pull-down control signal for controlling the first supplemental circuit, wherein the biasing circuit is configured to generate the pull-down control signal as proportional to absolute temperature (PTAT).

* * * * *

UNITED STATES PATENT AND TRADEMARK OFFICE
CERTIFICATE OF CORRECTION

PATENT NO. : 7,511,531 B2  Page 1 of 1
APPLICATION NO. : 11/519697
DATED : March 31, 2009
INVENTOR(S) : Pan et al.

It is certified that error appears in the above-identified patent and that said Letters Patent is hereby corrected as shown below:

On the Title page, in field (75), in "Inventors", in column 1, line 1, delete "Bosie" and insert -- Boise --, therefor.

Signed and Sealed this

Seventh Day of July, 2009

JOHN DOLL
*Acting Director of the United States Patent and Trademark Office*